(12) United States Patent
Wong et al.

(10) Patent No.: US 6,258,641 B1
(45) Date of Patent: Jul. 10, 2001

(54) OTP (OPEN TRIGGER PATH) LATCHUP SCHEME USING TRIPLE AND BURIED WELL FOR SUB-QUARTER MICRON TRANSISTORS

(75) Inventors: Shyh Chyi Wong, Taichung; Mong-Song Liang, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/244,878

(22) Filed: Feb. 5, 1999

(51) Int. Cl.$^7$ ................. H01L 21/8238; H01L 21/8248; H01L 21/74; H01L 21/76; H01L 21/761

(52) U.S. Cl. ................ 438/199; 438/218; 438/220; 438/221; 438/223; 438/224; 438/227; 438/228; 438/237; 257/372; 257/371; 257/351; 257/352; 257/354

(58) Field of Search ................ 438/199, 204, 438/206, 218, 220, 223, 224, 227, 228, 231; 257/372, 351, 352, 371

(56) References Cited

U.S. PATENT DOCUMENTS

| 5,397,734 | 3/1995 | Iguchi et al. | 437/70 |
|---|---|---|---|
| 5,453,397 | 9/1995 | Ema et al. | 437/69 |
| 5,470,766 | 11/1995 | Lien | 437/31 |
| 5,595,925 | 1/1997 | Chen et al. | 437/52 |
| 5,604,150 | 2/1997 | Mehrad | 437/70 |
| 5,702,988 | 12/1997 | Liang | 438/238 |

OTHER PUBLICATIONS

Wolf, "Silicon Processing for the VLSI Era", vol. 2: Process Integration, Lattice Press, Sunset Beach, CA (1990), p. 410.
Wolf, "Silicon Processing for the VLSI Era", vol. 3: The Submicron MOSFET, Lattice Press, Sunset Beach, CA (1995), p. 374.

*Primary Examiner*—Tom Thomas
*Assistant Examiner*—Bernard E. Souw
(74) *Attorney, Agent, or Firm*—George O. Saile; Stephen B. Ackerman

(57) ABSTRACT

Methods are described to prevent the inherent latchup problem of CMOS transistors in the sub-quarter micron range. Latchup is avoided by eliminating the low resistance between the $V_{dd}$ and $V_{ss}$ power rails caused by the latchup of parasitic and complementary bipolar transistor structure that are present in CMOS devices. These goals have been achieved without the use of guard rings by using a deep n-well to disconnect the pnp collector to npn base connection of two parasitic bipolar transistors, and by using a buried p-well to disconnect the npn collector to pnp base connection of those same two parasitic transistors. Further, the deep n-well is shorted to a supply voltage $V_{dd}$, and the buried p-well is shorted to a reference voltage $V_{ss}$ via both the P substrate and a P+ ground tab. The proposed methods do not require additional mask or processes.

29 Claims, 3 Drawing Sheets

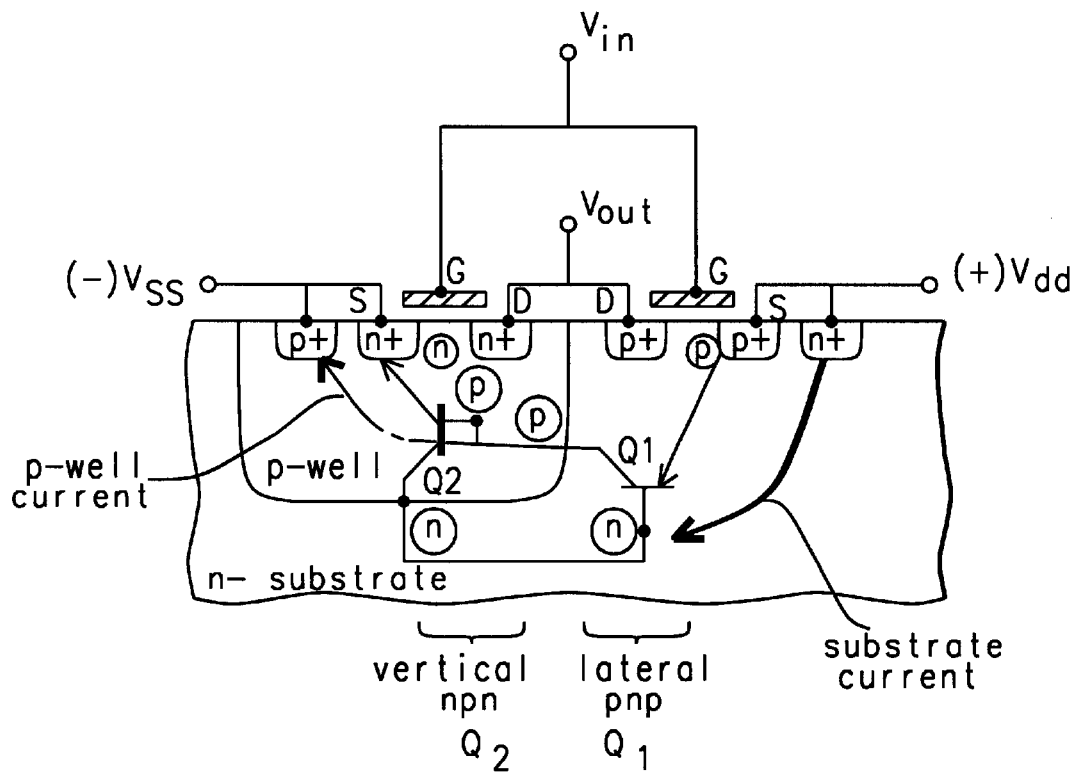
FIG. 1 – Prior Art
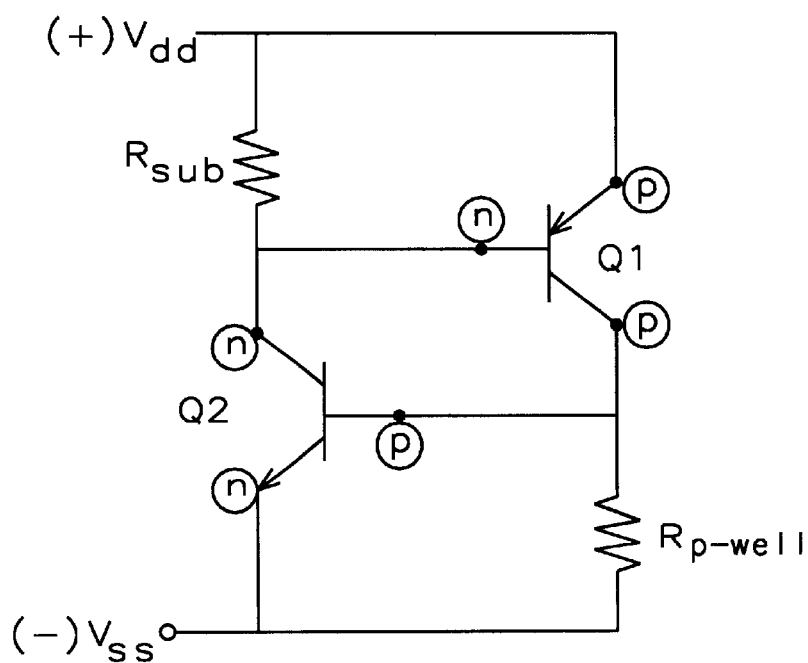
FIG. 2 – Prior Art

OTP (OPEN TRIGGER PATH) LATCHUP SCHEME USING TRIPLE AND BURIED WELL FOR SUB-QUARTER MICRON TRANSISTORS

RELATED PATENT APPLICATION

OTP (OPEN TRIGGER PATH) LATCHUP SCHEME USING BURIED-DIODE FOR SUB-QUARTER MICRON TRANSISTORS, title filing date: Oct. 30, 1998, Ser. No. 09/182,760 assigned to a common assignee, now U.S. Pat. No. 6,054,344, issued on Apr. 25, 2000.

BACKGROUND OF THE INVENTION

1. Field of the Invention

The invention relates to methods of producing integrated circuits on a semiconductor wafer, and more particularly to methods of fabricating complementary metal oxide semiconductor (CMOS) transistors without causing latchup.

2. Description of the Related Art

Latchup is a phenomenon of CMOS circuits and is well described by S. Wolf in *Silicon Processing for the VLSI Era*, Volume 2, by Lattice Press, copyright 1990, 6.4 LATCHUP IN CMOS, page 400: "A major problem in CMOS circuits is the inherent, self-destructive phenomenon known as latchup. Latchup is a phenomenon that establishes a very low-resistance path between the $V_{DD}$ and $V_{SS}$ power lines, allowing large currents to flow through the circuit. This can cause the circuit to cease functioning or even to destroy itself (due to heat damage caused by high power dissipation).

The susceptibility to latchup arises from the presence of complementary parasitic bipolar transistor structures, which result from the fabrication of the complementary MOS devices in CMOS structures. Since they are in close proximity to one another, the complementary bipolar structures can interact electrically to form device structures which behave like pnpn diodes."

FIG. 1 shows a cross-sectional view of a p-well CMOS inverter with input $V_{in}$, output $V_{out}$, supply voltage $(+)V_{dd}$, and reference voltage $(-)V_{ss}$. The n-channel (NMOS) transistor is in the p-well. Q1 is the lateral pnp parasitic transistor structure and Q2 is the vertical npn parasitic transistor structure which results from the arrangement of NMOS and p-channel (PMOS) transistors. The lateral transistor Q1 comprises the source S of the PMOS transistor (emitter), the n-substrate (base), and the p-well (collector). The vertical transistor Q2 comprises the source S of the NMOS transistor (emitter), the p-well (base), and the n-substrate (collector). The region of each terminal is identified by a circle with an "n" or a "p". Substrate current flows from $(+)V_{dd}$ through the n-substrate, having a resistance $R_{sub}$, to the collector of Q2. P-well current flows from the collector of Q1 through the p-well, having resistance $R_{p-well}$, to $(-)V_{ss}$.

FIG. 2, is an equivalent circuit diagram of the parasitic transistors of FIG. 1. Again the region of each transistor terminal is identified by a circle with an "n" or a "p". In this circuit the base of each transistor is connected to the collector of the other transistor. Inspection of FIG. 2 shows that this circuit is the equivalent of a parasitic pnpn diode (from emitter of Q1 to emitter of Q2). A pnpn diode below a certain "trigger" voltage acts as a high impedance, but when biased beyond that "trigger" voltage will act as a low impedance device similar to a forward biased diode. This results in a current that depends on $R_{sub}$ and $R_{p-well}$ and can be destructive to the CMOS circuit.

Clearly, latchup is not a new problem, however, it is becoming much more severe as devices shrink to quarter and sub-quarter micron dimensions, because of the reduced well depth and inter-well spacing. The method of providing a guard ring only stabilizes the potential on the surface and, hence, is not efficient in preventing latchup in the bulk of the semiconductor. Latchup can be avoided by isolating n-wells from p-wells at the cost of consuming more silicon real estate. Quoting from S. Wolf in *Silicon Processing for the VLSI Era*, Volume 3, by Lattice Press, copyright 1995, 6.6 CMOS ISOLATION TECHNOLOGY, page 374:

"The large area penalty of p-channel-to-n-channel device isolation is the most important reason why CMOS technologies using conventional isolation methods cannot achieve as high a packing density as NMOS. Furthermore, while new techniques such as epitaxy greatly reduce latchup susceptibility as CMOS is scaled down, they generally do not suppress leakage currents in the parasitic MOS structures. Hence, the layout spacing between an n-channel and a p-channel device may be limited by isolation failure rather than by latchup."

A large number of workers in the field have tackled the problem and found solutions which are suitable to one application or another, but the problem of latchup keeps on surfacing as transistor dimensions decrease in both the horizontal and vertical dimension.

U.S. Pat. No. 5,397,734 (Iguchi et al.) shows a method for fabrication a triple well construction.

U.S. Pat. No. 5,453,397 (Ema et al.) discloses a method capable of isolating fine pattern elements using LOCOS.

U.S. Pat. No. 5,470,766 (Lien) teaches a triple well with a p-region under FOX isolation regions. Lien addresses latch-up immunity for PMOS FETs.

U.S. Pat. No. 5,595,925 (Chen et al.) describes another triple well structure.

U.S. Pat. No. 5,604,150 (Mehrad) discloses a triple-well structure, where the channel-stop impurity is implanted using multiple doses at different energies.

U.S. Pat. No. 5,702,988 (Liang) teaches a method of forming a triple-well structure having n-well, p-well, and p-well in n-well regions.

None of the above-cited examples of the related art provide the combination of shallow trench isolation (STI) structures with a buried p-well, tieing the buried p-well to ground, and the deep n-well to Vdd to prevent latchup in deep sub-quarter micron technology.

SUMMARY OF THE INVENTION

It is an object of the present invention to provide methods to prevent the inherent latchup problem of CMOS circuits by eliminating the low resistance between the Vdd and Vss power rails caused by the latchup of parasitic, complementary bipolar transistors which are present in CMOS devices.

Another object of the present invention is to eliminate the use of guard rings and their concomitant penalty in silicon real estate.

A further object of the present invention is to provide the above benefits without adding additional masks or processes.

A yet further object of the present invention is to provide the above benefits for sub-quarter micron transistors.

These objects have been achieved by using a deep n-well to disconnect the pnp collector to npn base connection of two parasitic bipolar transistors, and by using a buried p-well to disconnect the npn collector to pnp base connection of those same two parasitic transistors. Furthermore, the deep n-well is shorted to a supply voltage $V_{dd}$, and the buried p-well is shorted to a reference voltage $V_{ss}$ via both the P substrate and a P$^+$ ground tab.

BRIEF DESCRIPTION OF THE DRAWINGS

FIG. 1 is a cross-sectional view of a p-well CMOS inverter of conventional design of the prior art with parasitic bipolar transistors shown schematically.

FIG. 2 is an equivalent circuit diagram of the parasitic bipolar transistors of FIG. 1.

DESCRIPTION OF THE PREFERRED EMBODIMENT

Figure 3:
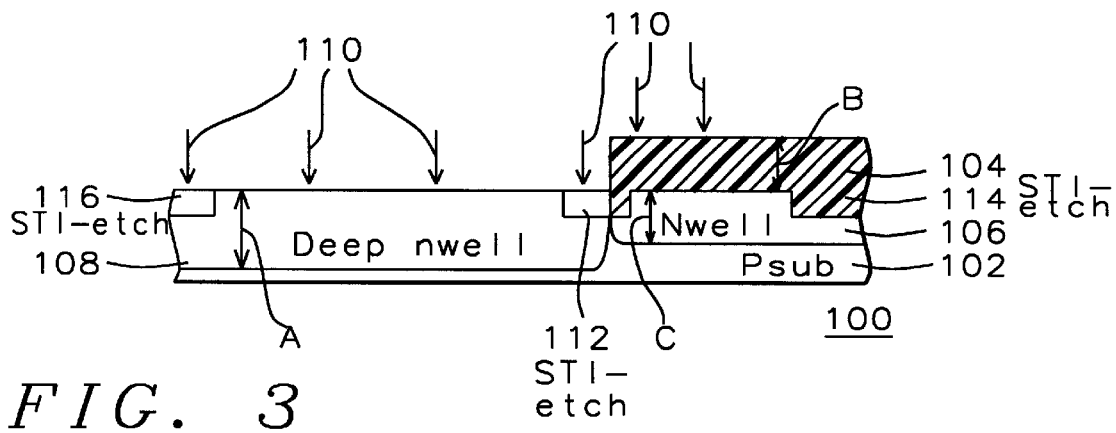
FIGS. 3 through 6 are cross-sectional views of a process sequence of fabricating a CMOS semiconductor device according to the embodiment of the present invention.

Referring now to FIGS. 3 to 7, we begin a description of the method of preventing latchup in complementary metal-oxide semiconductor (CMOS) transistors by opening the latchup path. FIG. 3 illustrates forming an n-well 106 and a deep n-well 108 on a p-substrate 102 of a semiconductor wafer 100, where the deep n-well is touching the n-well, etching shallow trench isolation (STI) structure 112, 114, and 116 to isolate n-well 106, deep n-well 108, and yet-to-be-formed p-well 120. STI structure 112 is shown straddling the n-well and the deep n-well.

Figure 4:
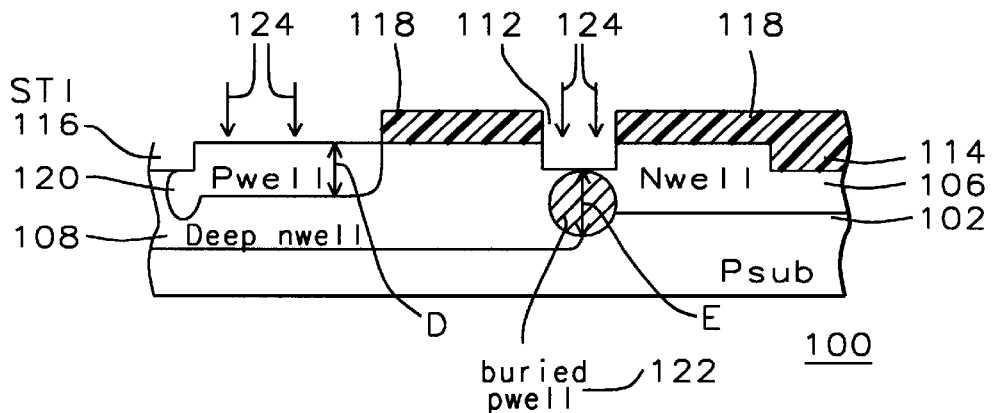

In FIG. 4, a p-well 120 is formed within deep n-well 108, and a buried p-well 122 is formed below STI structure 112. All three STI structures are filled with oxide in FIG. 5, PMOS transistors are created in n-well 106, and NMOS transistors are created in p-well 120. Next follow in FIG. 6 the implanting of an n$^+$ region 144 in deep n-well 108, and in FIG. 7, the implanting of a p$^+$ ground tab 146 in STI structure 112 and contacting it with buried p-well 122. See FIG. 7 for a cross-sectional side view of tab 146, STI structure 112, buried p-well 122, and p-substrate 102. Referring once more to FIG. 6, the method continues with connecting n$^+$ region 144 to a supply voltage $V_{dd}$, and connecting p$^+$ ground tab 146 to a reference voltage $V_{ss}$ (also see FIG. 7).

Figure 6:
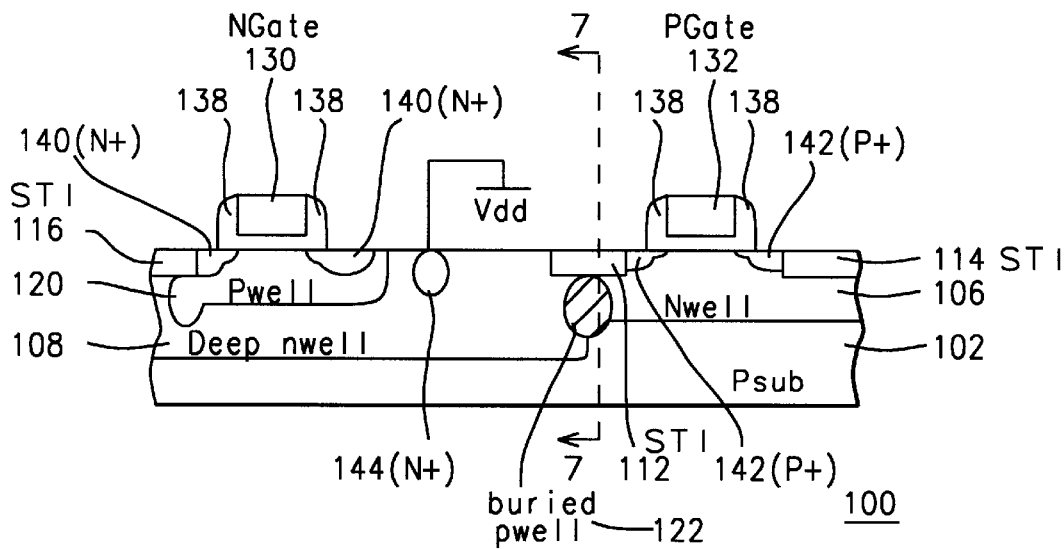
Figure 7:
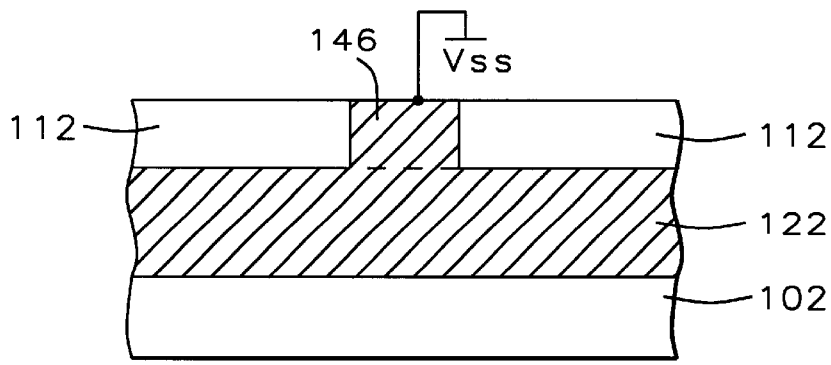
FIG. 7 is a view of the cross-section 7—7 of FIG. 6.
Figure 8:
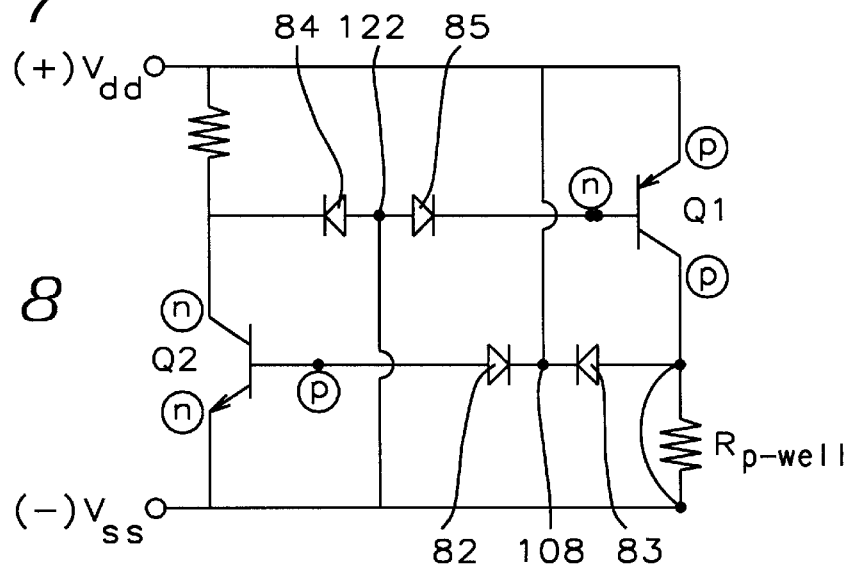
FIG. 8 is an equivalent circuit diagram of the parasitic bipolar transistors and of the four diodes of the CMOS transistor structure of FIG. 6.

We now describe in FIG. 8 the equivalent circuit diagram of the CMOS structure of FIG. 6. FIG. 8 has similarities with FIG. 2 of the prior art, except that diodes 82 to 85 have been added. Diodes 82 and 83 are joined at their cathodes (n-region) and tied to supply voltage $V_{dd}$. Diodes 84 and 85 are joined at their anodes (p-region) and tied to reference voltage $V_{ss}$. Both diode pairs are thus back-biased, i.e., not conducting. Diodes 82 and 83 represent the deep-well 108 and diodes 84 and 85 represent buried p-well 122. By introducing deep n-well 108 and connecting it via n$^+$ region 144 to supply voltage $V_{dd}$, the junction from p-well 120 to deep n-well 108 (equal to diode 82) and the junction from buried p-well 122 to deep n-well 108 (equal to diode 83) act both as reverse biased diodes, and thus the connection (trigger path) between the base of parasitic transistor Q2 and the collector of parasitic transistor Q1 is opened. Similarly by introducing buried p-well 122 and connecting it to reference voltage $V_{ss}$ via p$^+$ ground tab 146 and by its contact with p-substrate 102, the junction from buried p-well 122 to deep n-well 108 (equal to diode 84) and the junction from buried p-well 122 to n-well 106 (equal to diode 85) act both as reversed biased diodes, and thus the connection (trigger path) between the collector of parasitic transistor Q2 and the base of parasitic transistor Q1 is opened. By opening both trigger paths the latchup between Q1 and Q2 is eliminated. In addition since the p-region of diode 83 is connected to the reference voltage $V_{ss}$, resistor $R_{p\text{-}well}$ is effectively shorted, thereby tying the collector of Q1 to $V_{ss}$ as well.

Referring once again to FIG. 3, the method for manufacturing the present invention of preventing latchup in complementary metal-oxide semiconductor (CMOS) transistors begins with providing a semiconductor wafer 100 having a p-substrate 102. Providing a photoresist 104 (of thickness B) on top of p-substrate 102, and forming an n-well 106 (of thickness C) under photoresist 104 and forming a deep n-well 108 (of thickness A) in p-substrate 102 by implanting arsenic 110 in p-substrate 102, where deep n-well 108 is formed adjacent to n-well 106. N-well 106 and deep n-well 108 may also be implanted using phosphorus instead of arsenic 110. N-wells 106 and 108 are (can be) implanted simultaneously, with their junction depth difference A–C equal to photoresist 104 thickness B.

The dose for arsenic and phosphorus ranges from $1 \times 10^{11}$ to $1 \times 10^{13}$ atoms/cm$^2$. The implant energy for arsenic and phosphorus ranges from 80 to 300 keV. Next are etched a first shallow trench isolation (STI) structure 112, straddling n-well 106 and deep n-well 108, a second STI structure 114, located within n-well 106, and a third STI structure 116, located within deep n-well 108.

Referring now to FIG. 4, the method continues by covering semiconductor 100 with a second photoresist 118, etching away second photoresist 118 from a to-be-formed p-well 120 and first and third STI structures 112 and 116. Next follows the forming of p-well 120 (of thickness D) within deep n-well 108 and buried p-well 122 underneath first STI structure 112 by implanting boron 124. Boron difluoride BF$_2$ may also be used for implanting the p-well 120 and buried p-well 122 instead of boron 124. The dose for boron and boron difluoride ranges from $1 \times 10^{12}$ to $1 \times 10^{14}$ atoms/cm$^2$. The implant energy for boron and boron difluoride ranges from 30 to 100 keV.

Figure 5:
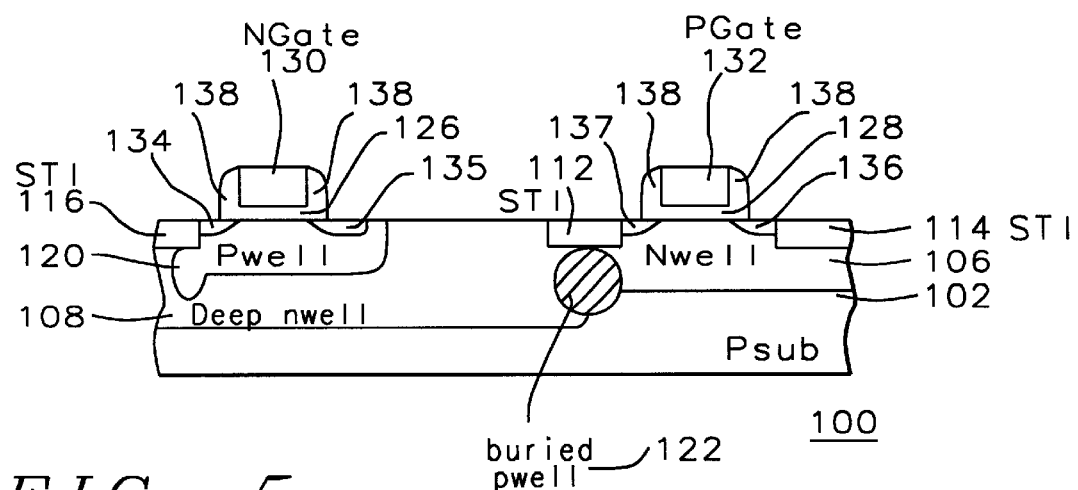

We continue the method with FIG. 5, by filling STI structures 112, 114, and 116 with oxide, where STI 112 isolates deep n-well 108 and n-well 106, where STI 114 isolates n-well 106 from other structure (not shown), and where STI 116 isolates p-well 120 from other structures (not shown), adjusting an n-channel (NMOS) voltage threshold by ion implantation in selected areas of p-well 120, adjusting a p-channel (PMOS) voltage threshold by ion implantation in selected areas of n-well 106, growing a first set of gate oxide layers 126 in those selected areas of p-well 120, growing, simultaneously with the previous step, a second set of gate oxide layers 128 in those selected areas of n-well 106, forming an n$^+$ polysilicon gate structure 130 on top of each of the first set of gate oxide layers 126, forming a p$^+$ polysilicon gate structure 132 on top of each of the second set of gate oxide layers 128, implanting lightly doped n-drains (Nldd) 134 and 135 to either side of the n$^+$ polysilicon gate structure 130, implanting lightly doped p-drains (Pldd) 136 and 137 to either side of the p$^+$ polysilicon gate structure 132, and forming sidewall spacers 138 to either side of n⁺ 130 and p⁺ 132 polysilicon gate structures.

The method continues with FIG. 6 by implanting n⁺ drains and n⁺ sources 140 to either side of the n⁺ polysilicon gate structures 130, implanting, simultaneously with the previous step, an n⁺ region 144 in deep n-well 108, implanting p⁺ drains and p⁺ sources 142 to either side of the p⁺ polysilicon gate structures 132, and referring to FIG. 74 implanting, simultaneously with the previous step, a p⁺ ground tab 146 in the first STI structure 112, where the p⁺ ground tab 146 contacts the buried p-well 122, connecting n⁺ region 144 to supply voltage $V_{dd}$, and connecting p⁺ ground tab 146 to reference voltage $V_{ss}$.

Referring to FIG. 3, the thickness of dee p n-well, indicated by letter "A", equals the combined thickness of photoresist 104, indicated by letter "B" and n-well 106, indicated by letter "C".

Referring to FIG. 4, p-well 120 terminates under the third STI structure 116, since structure 116 isolates p-well 120 from some other structure (not shown). The thickness of p-well 120, indicated by letter "D" equals the thickness of buried p-well 122, indicated by letter "E". The buried p-well 122 is in contact with the first STI layer 112, n-well 106, deep n-well 108, and p-substrate 102.

Referring to FIG. 5, nldd source 134 abuts against the third STI structure 116, pldd drain 137 abuts against the first STI structure 112, and pldd source 136 abuts against the second STI structure 114.

Referring to FIGS. 6, the junction from p-well 120 to deep n-well 108 acts as a reverse biased diode since n-well 108 is biased at $V_{dd}$. The junction from buried p-well 122 to deep n-well 108 acts as a reverse biased diode since n-well 108 is biased at $V_{dd}$. The junction from buried p-well 122 to deep n-well 108 acts as a reverse biased diode since buried p-well 122 is biased at $V_{ss}$. The junction from buried p-well 122 to n-well 106 acts as a reverse biased diode since buried p-well 108 is biased at $V_{ss}$. Buried p-well 122 is connected to reference voltage $V_{ss}$ also through p-substrate 102.

The thickness of p-well 120 and buried p-well 122 ranges from 50 to 1000 nm. The deep n-well concentration ranges from $1\times10^{16}$ to $1\times10^{18}$ atoms/cm³. The buried p-well concentration ranges from $1\times10^{16}$ to $5\times10^{18}$ atoms/cm². The depth of the shallow trench isolation (STI) structures ranges from 50 to 1000 nm.

The method of the present invention can claim the following advantages:

Both npn and pnp base current sources are eliminated by the reverse biased diodes, i.e., not latchup problem, The use of guard rings is avoided, Increased packing density, saving significant silicon real estate, No additional masks are required, No additional processes are required, Lowered cost of manufacturing product.

While the invention has been particularly shown and described with reference to the preferred embodiments thereof, it will be understood by those skilled in the art that various changes in form and details may be made without departing from the spirit and scope of the invention.

What is claimed is:

1. A method of preventing latchup in complementary metal-oxide semiconductor (CMOS) transistors, comprising:

providing a semiconductor wafer having a p-substrate;

etching shallow trench isolation (STI) structures for isolation;

forming an n-well on top of said p-substrate;

forming, simultaneously with the previous step, a deep n-well on top of said p-substrate, said deep n-well touching said n-well;

forming a p-well within said deep n-well;

forming, simultaneously with the previous, step a buried p-well below one of said STI structures, said buried p-well located where said n-well and said deep n-well touch;

creating P-MOS transistors in said n-well;

creating N-MOS transistors in said p-well;

implanting a p⁺ ground tab in said STI structure;

implanting an n⁺ region in said deep n-well;

contacting said p⁺ ground tab with said buried p-well;

connecting said n⁺ region to a supply voltage; and connecting said p⁺ ground tab to a reference voltage.

2. The method of claim 1, wherein a junction from said p-well to said deep n-well acts as a reverse biased diode.

3. The method of claim 1, wherein a junction from said buried p-well to said deep n-well acts as a reverse biased diode.

4. The method of claim 1, wherein a junction from said buried p-well to said deep n-well acts as a reverse biased diode.

5. The method of claim 1, wherein a junction from said buried p-well to said n-well acts as a reverse biased diode.

6. The method of claim 1, wherein said buried p-well is connected to said reference voltage through said p-substrate.

7. A method of preventing latchup in complementary metal-oxide semiconductor (CMOS) transistors, comprising:

providing a semiconductor wafer having a p-substrate;

providing a first photoresist on top of said p-substrate;

etching a first shallow trench isolation (STI) structure;

etching a second STI structure, where said second STI structure is located partially under said first photoresist;

etching a third STI structure, where said third STI structure is located under said first photoresist;

forming an n-well under said first photoresist by implanting arsenic or phosphorus in said p-substrate;

forming a deep n-well by implanting arsenic or phosphorus in said p-substrate, said deep n-well formed adjacent to said n-well;

covering said semiconductor with a second photoresist;

etching away said second photoresist from said p-well and said first and third STI structure;

forming a p-well within said deep n-well by implanting boron or boron difluoride $BF_2$;

forming a buried p-well underneath said first STI structure by implanting boron or boron difluoride $BF_2$;

filling said STI structures with oxide to isolate said deep n-well and said n-well;

adjusting an n-channel (NMOS) voltage threshold by ion implantation in areas of said p-well;

adjusting a p-channel (PMOS) voltage threshold by ion implantation in areas of said n-well;

growing a first set of gate oxide layers in said areas of said p-well;

growing, simultaneously with the previous step, a second set of gate oxide layers in said areas of said n-well;

forming an n⁺ polysilicon gate structure on top of each of said first set of gate oxide layers;

forming a p⁺ polysilicon gate structure on top of each of said second set of gate oxide layers;

implanting lightly doped n-drains (Nldd) to either side of said n⁺ polysilicon gate structure;

implanting lightly doped p-drains (Pldd) to either side of said p⁺ polysilicon gate structure;

forming sidewall spacers to either side of said n⁺ and p⁺ polysilicon gate structures;

implanting n⁺ drains and n⁺ sources to either side of said n⁺ polysilicon gate structures;

implanting, simultaneously with the previous step, an n⁺ region in said deep n-well;

implanting p⁺ drains and p⁺ sources to either side of said p⁺ polysilicon gate structures;

implanting, simultaneously with the previous step, a p⁺ ground tab in said first STI structure, said p⁺ ground tab contacting said buried p-well;

connecting said n⁺ region to a supply voltage; and connecting said p⁺ ground tab to a reference voltage.

8. The method of claim 7, wherein the dose for arsenic and phosphorus ranges from $1\times10^{11}$ to $1\times10^{13}$ atoms/cm².

9. The method of claim 7, wherein the implant energy for arsenic and phosphorus ranges from 80 to 300 keV.

10. The method of claim 7, wherein the dose for boron and boron difluoride BF₂ ranges from $1\times10^{12}$ to $1\times10^{14}$ atoms/cm².

11. The method of claim 7, wherein the implant energy for boron and boron difluoride BF₂ ranges from 30 to 100 keV.

12. The method of claim 7, wherein the thickness of said deep n-well equals the combined thickness of said first photoresist and said n-well.

13. The method of claim 7, wherein said p-well terminates under said third STI structure.

14. The method of claim 7, wherein the thickness of said p-well equals the thickness of said buried p-well.

15. The method of claim 7, wherein said buried p-well is in contact with said n-well.

16. The method of claim 7, wherein said buried p-well is in contact with said deep n-well.

17. The method of claim 7, wherein said buried p-well is in contact with said p-substrate.

18. The method of claim 7, wherein said n⁺ sources abut against said third STI structures.

19. The method of claim 7, wherein said p⁺ drains abut against said first STI structures.

20. The method of claim 7, wherein said p⁺ source abut against said second STI structures.

21. The method of claim 7, wherein a junction from said p-well to said deep n-well acts as a reverse biased diode.

22. The method of claim 7, wherein a junction from said buried p-well to said deep n-well acts as a reverse biased diode.

23. The method of claim 7, wherein a junction from said buried p-well to said deep n-well acts as a reverse biased diode.

24. The method of claim 7, wherein a junction from said buried p-well to said n-well acts as a reverse biased diode.

25. The method of claim 7, wherein said buried p-well is connected to said reference voltage through said p-substrate.

26. The method of claim 7, wherein the thickness of said p-well and said buried p-well ranges from 50 to 1000 nm.

27. The method of claim 7, wherein said deep n-well has a concentration ranging from $1\times10^{16}$ to $1\times10^{18}$ atoms/cm³.

28. The method of claim 7, wherein said buried p-well has a concentration ranging from $1\times10^{16}$ to $5\times10^{18}$ atoms/cm².

29. The method of claim 7, wherein the depth of said first, second, and third shallow trench isolation (STI) structure ranges from 50 to 1000 nm.

* * * * *